US007463101B2

(12) United States Patent
Tung

(10) Patent No.: US 7,463,101 B2
(45) Date of Patent: Dec. 9, 2008

(54) VOLTAGE CONTROLLED OSCILLATOR WITH TEMPERATURE AND PROCESS COMPENSATION

(75) Inventor: Yen-Chang Tung, Taoyuan County (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 726 days.

(21) Appl. No.: 10/711,380

(22) Filed: Sep. 15, 2004

(65) Prior Publication Data

US 2005/0258910 A1    Nov. 24, 2005

(30) Foreign Application Priority Data

May 21, 2004    (TW) .............................. 93114371 A

(51) Int. Cl.
*H03K 3/354* (2006.01)
(52) U.S. Cl. .................... 331/57; 327/538; 327/548
(58) Field of Classification Search .................. 331/57; 327/538, 548
See application file for complete search history.

(56) References Cited

U.S. PATENT DOCUMENTS

| 5,331,295 | A | * | 7/1994 | Jelinek et al. | ................. 331/57 |
| 5,798,669 | A | * | 8/1998 | Klughart | ..................... 327/539 |
| 2002/0113651 | A1 | * | 8/2002 | Burt | .......................... 330/258 |

* cited by examiner

Primary Examiner—Joseph Chang
(74) Attorney, Agent, or Firm—Jianq Chyun IP Office

(57) ABSTRACT

A voltage control oscillator, outputting a clocking signal with a specific frequency according to an input voltage level, has a constant current source, a voltage/current converter, a current mirror and an oscillating circuit. The constant current source provides a predetermined reference current. The voltage/current converter is coupled to the constant current source, for determining a first current flowing through the voltage/current converter according to the input voltage. The current mirror has a first current terminal coupled to the constant current source, for determining a third current flowing through a second current terminal according to the second current flowing through the first current terminal, wherein the second current is the reference current subtracted by the first current. The oscillating circuit is coupled to the second current terminal of the current mirror, for determining a frequency of the clocking signal according to the third current.

16 Claims, 10 Drawing Sheets

VOLTAGE CONTROLLED OSCILLATOR WITH TEMPERATURE AND PROCESS COMPENSATION

CROSS-REFERENCE TO RELATED APPLICATION

This application claims the priority benefit of Taiwan application serial no. 93114371, filed May 21, 2004.

BACKGROUND OF THE INVENTION

1. Field of the Invention

The present invention relates to an oscillator, and more particularly, to a voltage control oscillator.

2. Description of Related Art

A common VCO is illustrated as FIG. 1A. Referring to FIG. 1A, it is a schematic block diagram of a common VCO. In FIG. 1A, a clock signal CLK outputted from the VCO 100 is controlled by an input voltage VCOIN. The VCO 100 comprises a voltage/current converter 110 and a current control oscillating circuit 120. For the current control oscillating circuit 120, under a same supplying current 111, the oscillating frequency is lower if fabricated with SLOW process or operated in higher temperature, whereas the oscillating frequency is higher if fabricated with FAST process or operated in lower temperature.

Referring to FIG. 1B, it illustrates a schematic diagram of a conventional circuit of the voltage/current converter 110 of the VCO in FIG. 1A. In FIG. 1B, the supplying current 111 of the CCO 120 is designed as equal to the current IP, where $IP=K*(VCOIN-VTHN)^2$, where K is a constant, VTHN is a threshold voltage of the N-type transistor 112. The threshold voltage VTHN varies with the fabricating process or temperature. In other words, VTHN is increased as fabricated with SLOW process or higher temperature, whereas VTHN is decreased as fabricated with FAST process or lower temperature. Therefore, under a same input voltage level VCOIN, if fabricated with SLOW process or higher temperature, the current IP (current 111) is decreased, thus frequency of the clock signal CLK is slower; whereas if fabricated with FAST process or lower temperature, the current IP (current 111) is increased, thus frequency of the clock signal CLK is faster.

Referring to FIG. 1C, it illustrates a schematic diagram of frequency vs. voltage of the VCO in FIG. 1A. In FIG. 1C, a system voltage is assigned to 3.3 volts. It is obvious that with different fabrication process and different temperature, various output frequencies are generated under a same input voltage level.

A phase lock loop (PLL) is a common application for a VCO. The operating frequency range, FM distortion, central frequency migration, the central frequency and the current/voltage sensitivity of the PLL are all featured by the VCO thereof. The central frequency may migrate because the transient switching time significantly dominates the oscillating period, and during switching period, the transient phenomenon is related to parasitic capacitance of the circuit, resistance of the circuit, gm of the transistor and input resistance of the transistor, which are highly related to temperature. Moreover, since fabrication fluctuation results in change of circuit states, the factors are all significant when designed to comply with specs and yield requirement. In a conventional scheme, usually enlarging the circuit area, and increasing operating current and voltage incur undesirable cost inflation.

SUMMARY OF THE INVENTION

In the light of the above descriptions, the present invention is directed to a voltage control oscillator, for resisting process fluctuation and temperature variance to the VCO, and reducing fabrication cost.

The present invention provides a VCO, for outputting a clocking signal having a specific frequency according to input voltage. The VCO comprises a constant current source, a voltage/current converter, a current mirror and an oscillating circuit. The constant current source provides a predetermined reference current. The voltage/current converter is coupled to the current source, for determining a first current flowing through the voltage/current converter according to the input voltage. The current mirror has a first current terminal and a second current terminal, where the first current terminal is coupled to the constant current source, for determining a third current flowing through the second current terminal according to the second current flowing through the first current terminal, wherein the second current is the reference current subtracted by the first current. The oscillating circuit is coupled to the second current terminal of the current mirror, for determining a frequency of the clocking signal according to the third current.

According to one embodiment of the present invention, the foregoing constant current source has a reference current input terminal and a reference current output terminal. Wherein, the reference current output terminal is coupled to ground voltage level, and the reference input terminal is coupled to the voltage/current converter and receives a first current therefrom and a second current outputted from the first current terminal of the current mirror.

According to an embodiment of the present invention, wherein the constant current source has a reference current input terminal and a reference current output terminal. Wherein the reference current input terminal is couple to the system voltage level, and the reference current output terminal is coupled to the voltage/current converter and the first current terminal of the current mirror.

The circuit in the present invention is divided into two parts. The first part of the circuit is positively correlated to the fabricating process or temperature, and the other part of the circuit is negatively correlated to the fabricating process or temperature. Therefore, by adjusting the correlation coefficient of the two parts, the circuit stays stable when either fabricating process or temperature factor changes, since the two foregoing effects compensate each other. The VCO is thus immune in either process fluctuation or temperature variation.

DESCRIPTION OF THE EMBODIMENTS

The circuit in the present invention comprises two parts: one part is positively correlated to the fabrication process or temperature; and the other part is negatively correlated to the fabrication process or temperature. By adjusting the variation rate of the factors of the two parts, the circuit can be controlled stable with the factors. When the current control oscillator CCO is supplied with a same current, if using SLOW fabrication process or higher temperature, the oscillating frequency is lower, whereas if using FAST fabricating process or lower temperature, the oscillating frequency is higher. Therefore, the voltage/current converter is designed to supply higher current under SLOW fabrication process or higher temperature, and to supply lower current under FAST fabrication process or lower temperature in the present invention. With a same input voltage VCOIN, the VCO generates a similar frequency, such that oscillating frequency is generated within designated range with proper control voltage.

Figure 1A:
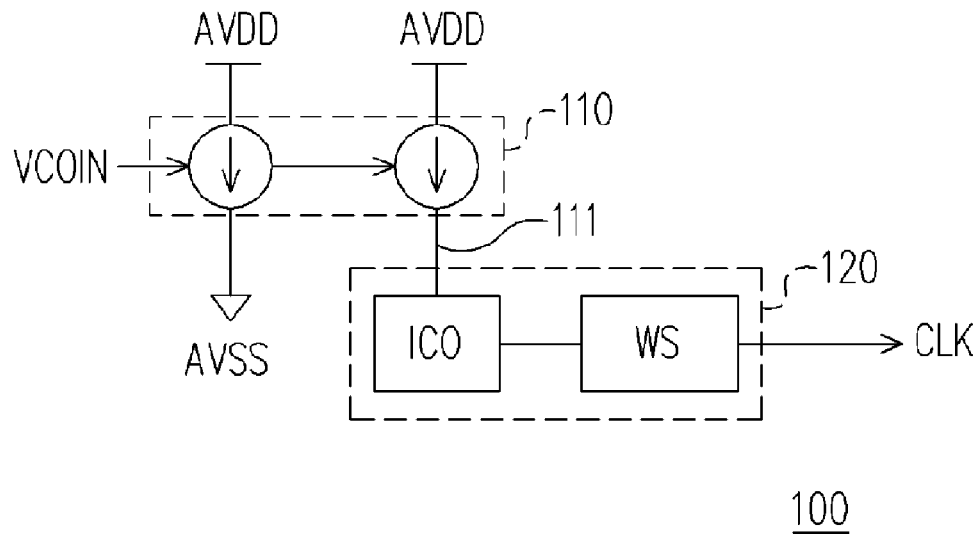
FIG. 1A is a schematic diagram illustrating a conventional VCO.
Figure 1B:
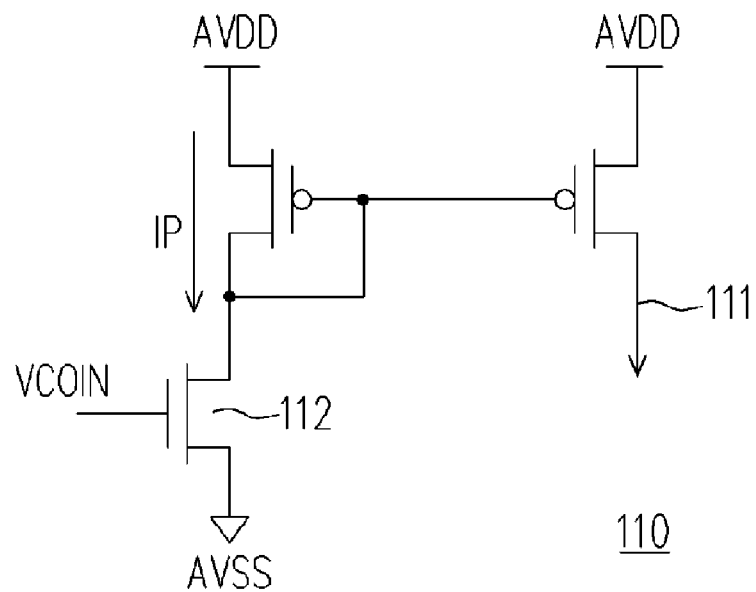
FIG. 1B is a schematic circuit diagram illustrating a conventional voltage/current converter of the VCO in FIG. 1A.
Figure 1C:
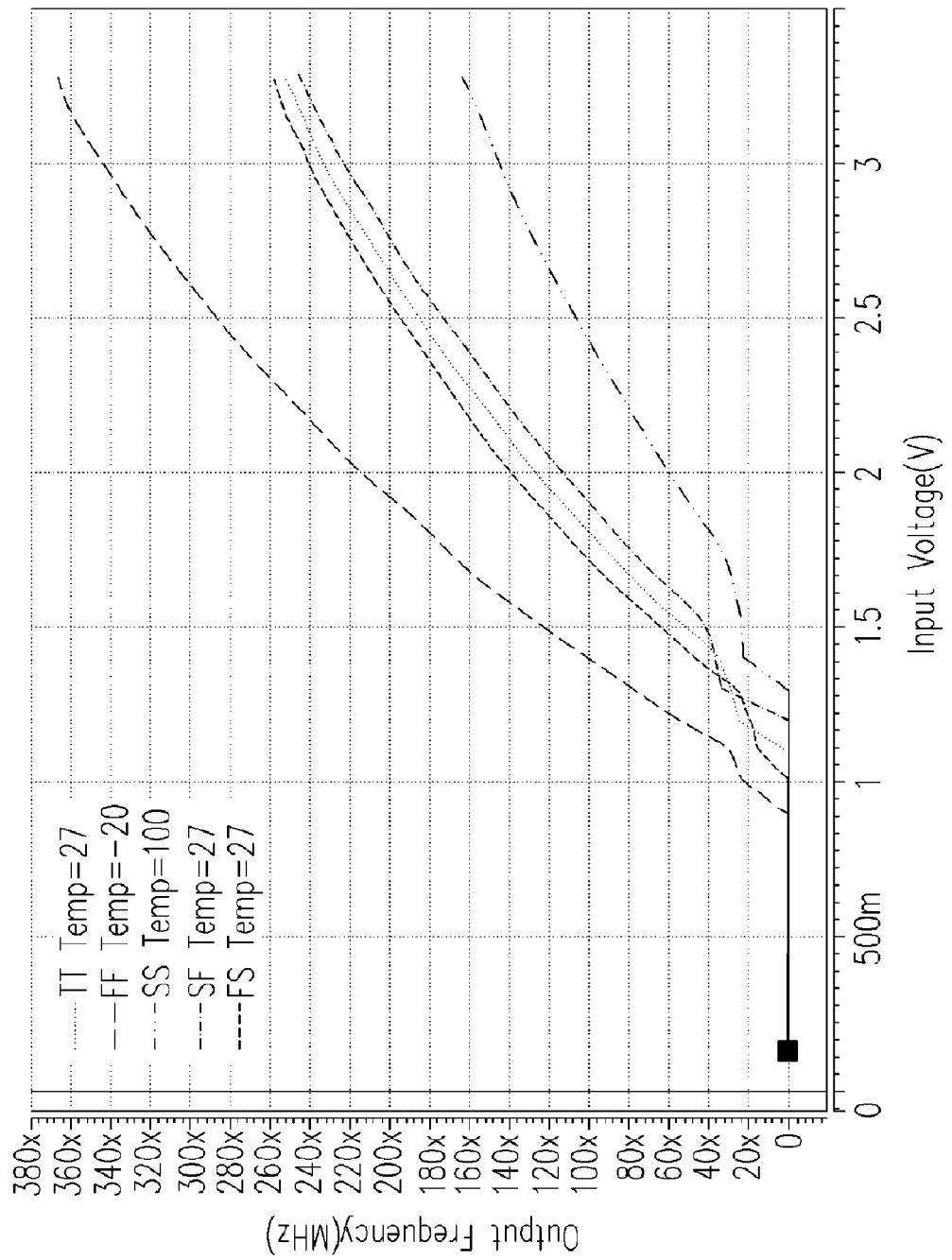
FIG. 1C is a schematic diagram illustrating frequency vs. voltage of the VCO in FIG. 1A.
Figure 2A:
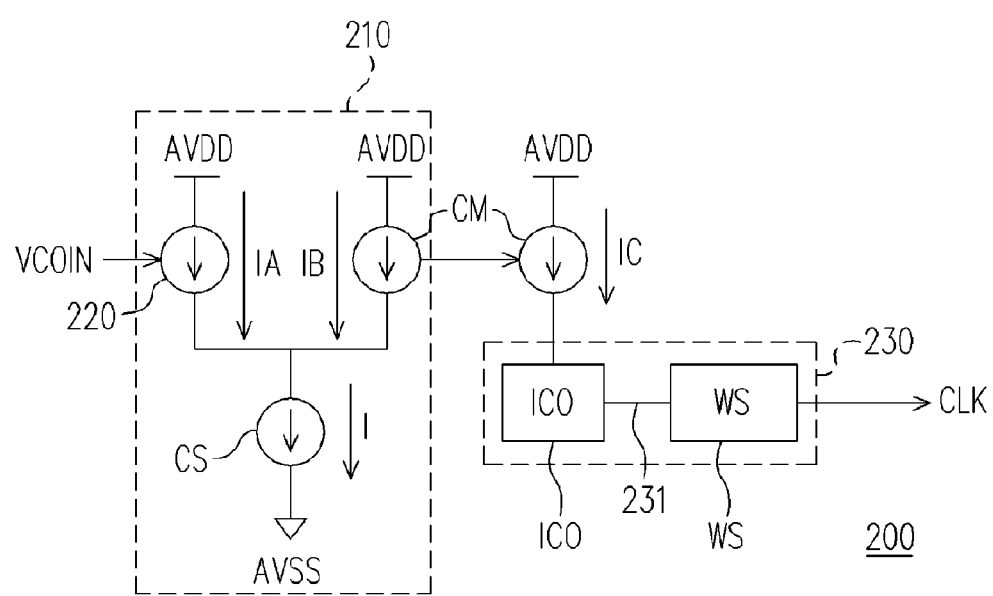
FIG. 2A is a schematic block diagram illustrating a VCO capable of compensating temperature variation and process fluctuation according to one embodiment of the present invention.

Referring to FIG. 2A, it illustrates a schematic block diagram of a VCO capable of compensating temperature variation and fabrication process fluctuation. In FIG. 2A, a frequency is determined and a clock signal CLK is outputted from the VCO 200 in accordance with an input voltage VCOIN. The constant current source CS serves to supply a predetermined constant reference current I. Wherein, a reference current output terminal of the constant current source CS is coupled to a ground voltage level. The voltage/current converter 220 is coupled to the reference current input terminal of the constant current source CS. The voltage/current converter 220 receives and determines a first current IA therethrough in accordance with the input voltage VCOIN. The current mirror CM has a first current terminal and a second current terminal, where the first current terminal is coupled to the reference current input terminal of the constant current CS. The current mirror CM determines a third current IC passing through the second current terminal in accordance with the second current IB passing through the first current terminal. According to the figure, it is understood that a sum of the first current IA and the second current IB is the reference current I. Since the reference current I is a predetermined constant current, the second current IB is thus determined by the reference current I subtracted by the first current IA.

The oscillating circuit 230 is coupled to the second current terminal of the current mirror CM, for determining a frequency of the clock signal CLK outputted in accordance with the third current IC. In an embodiment of the present invention, the third current IC is approximately equal to the second current IB. Therefore, if using SLOW fabrication process or higher temperature such that the first current IA is decreased, the second current IB (which is approximately the third current IC) is thus increased. Whereas if using FAST fabrication process or lower temperature such that the first current IA is increased, the second current IB (i.e. the third current IC) is thus decreased. Therefore, the oscillating circuit 230 generating lower frequency resulted by SLOW fabrication process or higher temperature, or higher frequency resulted by FAST fabrication process or lower temperature is compensated.

In an embodiment of the present invention, the oscillating circuit comprises current control oscillator ICO and the wave shaping circuit WS, for example. The current control oscillator ICO is coupled to the second current terminal of the current mirror CM, for receiving and determining an output frequency of the pulse signal 231 in accordance with the third current IC. The wave shaping circuit WS is coupled to the current control oscillator ICO for shaping the pulse signal 231 into a clock signal CLK with a predetermined signal CLK.

Figure 2B:
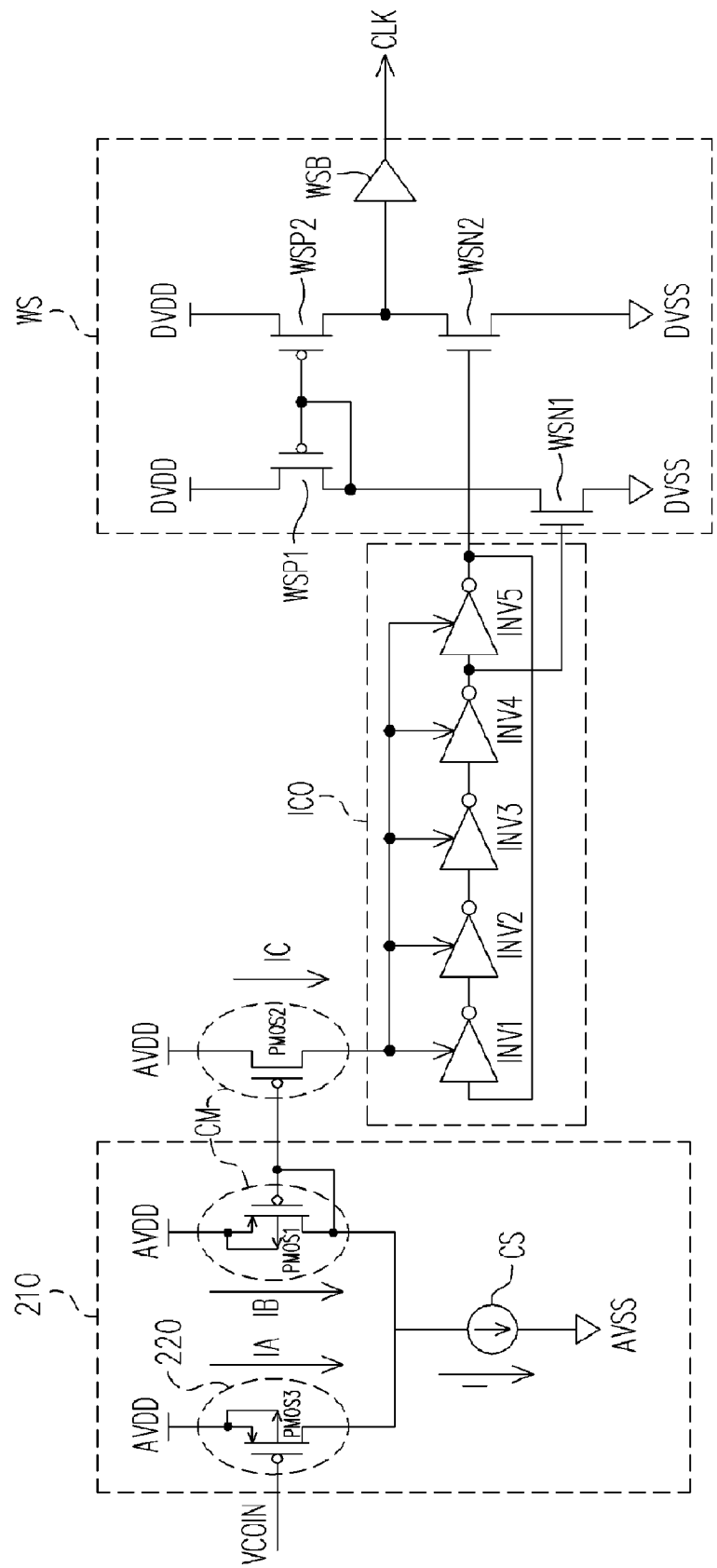
FIG. 2B is a schematic circuit diagram illustrating a VCO capable of compensating temperature variation and process fluctuation according to one embodiment of the present invention.

In an embodiment of the present invention, the current control oscillator ICO is implemented as illustrated in FIG. 2B, for example. Referring to FIG. 2B, it illustrates a schematic circuit diagram of a VCO capable of compensating temperature variation and fabrication process fluctuation. In FIG. 2B, the ICO comprises inverters INV1~INV5 coupled in series. Operating speed of each stage of the inverters is determined according to the third current IC.

In an embodiment of the present invention, the wave shaping circuit WS is implemented according to the FIG. 2B, for example. A gate of a transistor WSN1 is coupled to an output terminal of the inverter INV4, and a source of which is coupled to the ground voltage level DVSS. A drain of a transistor WSP1 is coupled to a drain of the transistor WSN1, and a source of the transistor WSP1 is coupled to a system voltage DVDD. A gate of a transistor WSN2 is coupled to an output terminal of the inverter INV5, and a source of the transistor WSN2 is coupled to the ground voltage level DVSS. A drain of a transistor WSP2 is coupled to a drain of the transistor WSN2, and a source of the transistor WSP2 is coupled to the system voltage DVDD. A gate of the transistor WSP1 and a gate of the transistor WSP2 are both coupled to the drain of the transistor WSP1. An output terminal of the buffer WSB is coupled to the drain of the transistor WSP2, and outputs the clock signal CLK therefrom.

In an embodiment of the present invention, the current mirror CM is implemented as illustrated in FIG. 2B, for example. The current mirror CM comprises P-type transistors PMOS1 and PMOS2. A source of the transistor PMOS1 is coupled to the system voltage AVDD, and a gate and a drain of the PMOS1 are both coupled to the reference current input terminal of the constant current source CS. A source of the transistor PMOS2 is coupled to the system voltage AVDD, and a gate of the PMOS2 is coupled to the gate of the transistor PMOS1. A drain of the transistor PMOS2 is coupled to the current control oscillator ICO.

In an embodiment of the present invention, the voltage/current converter 220 is implemented as illustrated in FIG. 2B, for example. A gate of a P-type transistor PMOS3 receives the input voltage VCOIN, a source of the PMOS3 is coupled to the system voltage AVDD, and a drain of the PMOS3 is coupled to the reference current input terminal of the constant current source CS and outputs a first current IA therefrom. Moreover, a body of the transistor PMOS3 is coupled to the source of the transistor PMOS3, for example.

The voltage/current converter 210 in FIG. 2A is designed according to different aspects under different requirement, where the resulting circuits are all within the scope of the present invention. For further understanding, several embodiments of circuit 210 are described as follows.

Figure 2C:
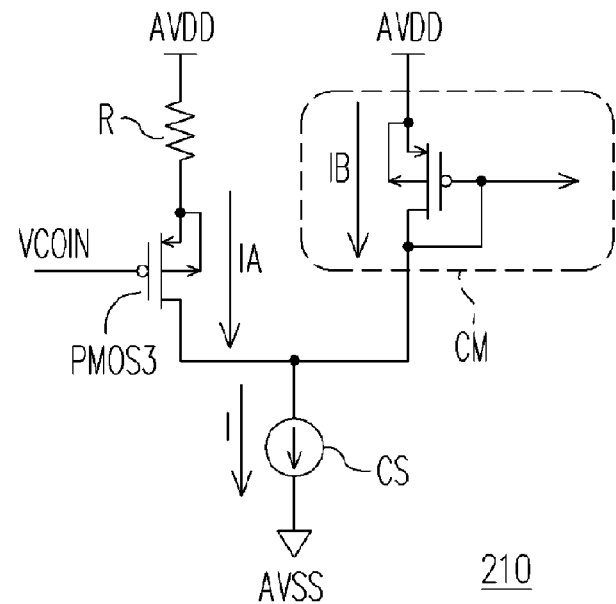
FIG. 2C is a schematic circuit diagram of another voltage/current converter of the VCO capable of compensating temperature variation and process fluctuation according to one embodiment of the present invention.

Referring to FIG. 2C, it illustrates a schematic circuit diagram of another voltage/current converter of the VCO capable of compensating temperature variation and fabrication process fluctuation. A gate of the P-type transistor PMOS3 receives the input voltage VCOIN, and a drain of the PMOS3 is coupled to the reference current input terminal of the constant current source CS, and outputs a first current IA therefrom. A terminal of a resistor R is coupled to the system voltage AVDD, and the other terminal of the resistor R is coupled to a source of the transistor PMOS3. The reference current output terminal of the constant current source CS is coupled to the ground voltage level AVSS. Wherein the current mirror CM is identical to that of FIG. 2A, thus is not repeated herein.

Figure 2D:
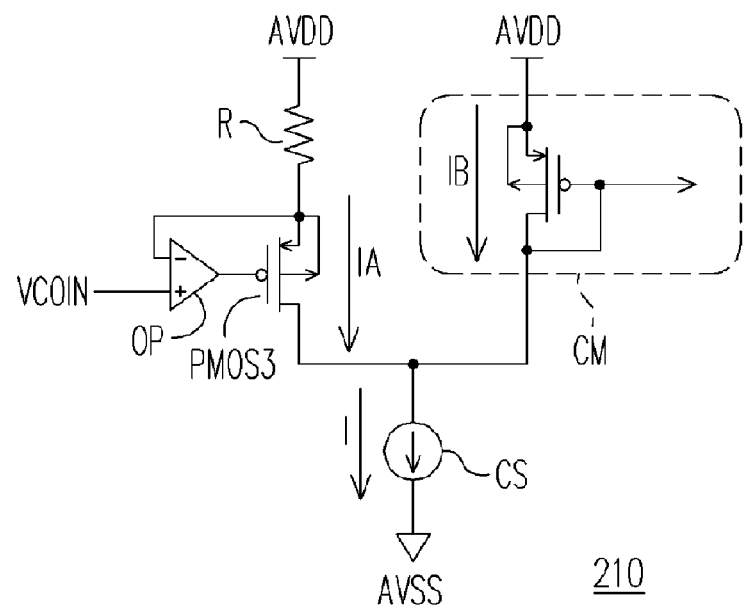
FIG. 2D is a schematic circuit diagram of yet another voltage/current converter of the VCO capable of compensating temperature variation and process fluctuation according to one embodiment of the present invention.

Referring to FIG. 2D, it illustrates a schematic circuit diagram of another voltage/current converter of the VCO capable of compensating temperature variation and fabrication process fluctuation. FIG. 2D, being similar to FIG. 2C, whereas an additional operational amplifier OP is disposed. The operational amplifier OP is coupled between the input voltage VCOIN and a gate of the transistor PMOS3. Wherein a positive input terminal of the operational amplifier OP receives the input voltage VCOIN, a negative input terminal of the operational amplifier OP is coupled to the source of the transistor PMOS3, and an output terminal of the operational amplifier OP is coupled to the gate of the transistor PMOS3.

Figure 2E:
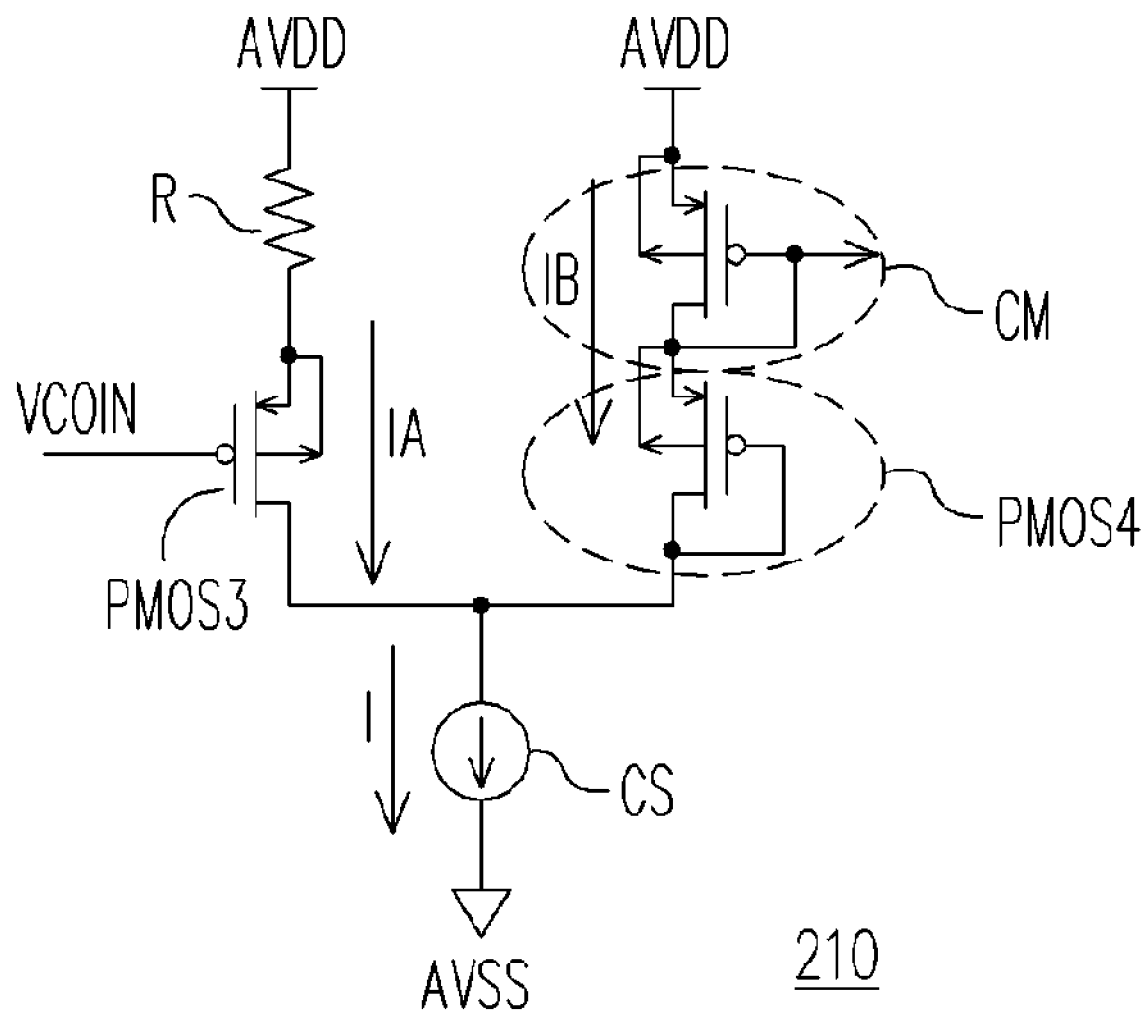
FIG. 2E is a schematic circuit diagram of yet another voltage/current converter of the VCO capable of compensating temperature variation and process fluctuation according to one embodiment of the present invention.

Referring to FIG. 2E, it illustrates a schematic circuit diagram of another voltage/current converter of the VCO capable of compensating temperature variation and fabrication process fluctuation. FIG. 2E, being similar to FIG. 2C, whereas an additional P-type transistor PMOS4 is disposed. The transistor PMOS4 is coupled between a first current terminal of the current mirror CM and the reference current input terminal of the constant current source CS. Wherein a source of the transistor PMOS4 is coupled to the first current terminal of the current mirror CM, and a gate and a drain of the transistor PMOS4 are coupled to the reference current input terminal of the constant current source CS. Herein, the transistor PMOS4 is a P-type transistor, for example, yet for the skill in the art, an amount of the P-type transistor PMOS4 can be modified upon request, which is also within the scope of the present invention.

Figure 3A:
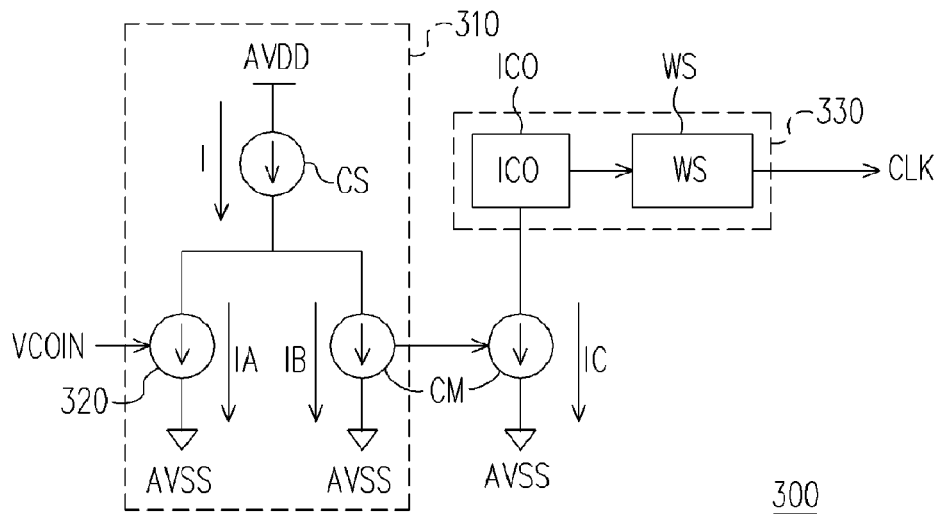
FIG. 3A is a schematic circuit diagram of a voltage/current converter of a VCO capable of compensating temperature variation and process fluctuation according to another embodiment of the present invention.

Another embodiment of the present invention is exemplary hereinafter for further description. Referring to FIG. 3A, it illustrates a schematic block diagram of the VCO capable of compensating temperature variation or fabrication process fluctuation. In FIG. 3A, the VCO 300 determines frequency of a clock signal CLK and outputs therefrom in accordance with an input voltage VCOIN. The constant current source CS provides a predetermined constant reference current I. Wherein the reference current input terminal of the constant current source CS is coupled to the system voltage AVDD. The voltage/current converter 320 is coupled to the reference current output terminal of the constant current source CS. The voltage/current converter 320 receives and determines a first current IA therethrough according to the input voltage VCOIN. The current mirror CM has a first current terminal and a second current terminal, where the first current terminal is coupled to the reference current output terminal of the constant current source CS. The current mirror CM determines a third current IC passing through the second current terminal in accordance with the second current IB passing through the first current terminal. According to the figure, a sum of the first current IA and the second current IB is the reference current I. Since the reference current I is a predetermined constant current, the second current IB is determined by the reference current I subtracted by the first current IA.

The oscillating circuit 330 is coupled to the second current terminal of the current mirror CM, for determining a frequency of an output clock signal CLK according to the third current IC. In an embodiment of the present invention, the third current IC is approximately equal to the second current IB. Therefore, if using SLOW fabrication process or higher temperature such that IA is decreased, the second current IB (i.e. the third current IC) is thus increased. On the contrary, if using FAST fabrication process or lower temperature such that IA is increased, the second current IB (i.e. the third current IC) is thus decreased. Therefore, it can be compensated for the oscillating circuit 330 about the decrease of output frequency due to using SLOW fabrication process or higher temperature, or the increase of output frequency due to using FAST fabrication process or lower temperature.

In an embodiment of the present invention, the oscillating circuit 330 comprises a current control oscillator ICO and a wave shaping circuit WS, for example. The oscillating circuit 330 is identical to the oscillating circuit 230 as illustrated in FIGS. 2A and 2B, thus is not repeatedly described herein.

In an embodiment of the present invention, the current mirror CM comprises a first N-type transistor NMOS1 and a second N-type transistor NMOS2, for example. A source of the first N-type transistor NMOS1 is coupled to the ground voltage level, and a gate and a drain of the NMOS1 are coupled to the reference current output terminal of the constant current source CS. A source of the second N-type transistor is coupled to the ground voltage level, and a gate of the second N-type transistor NMOS2 is coupled to the gate of the first N-type transistor NMOS1. A drain of the second N-type transistor is coupled to the oscillating circuit 330.

The circuit 310 in FIG. 3A can be designed according to different aspects under different requirement, where the resulting circuits are all within the scope of the present invention. For further understanding, several embodiments of circuit 310 are described as follows.

Figure 3B:
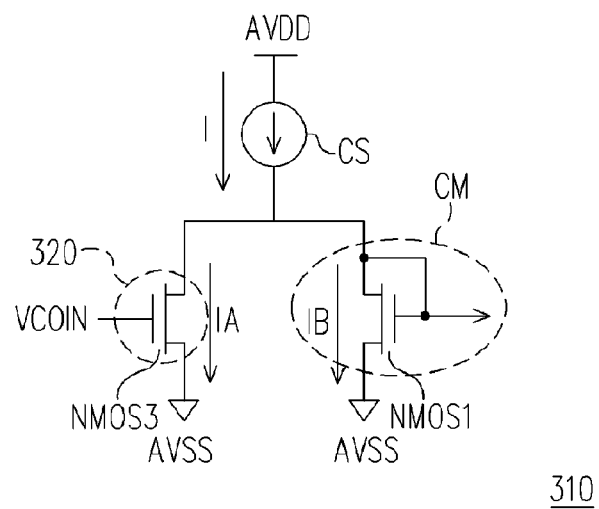
FIG. 3B is a schematic circuit diagram of another voltage/current converter of a VCO capable of compensating temperature and process fluctuation according to another embodiment of the present invention.

Referring to FIG. 3B, it illustrates a voltage/current converter of a VCO capable of compensating temperature variation or fabrication process fluctuation. In this embodiment, the voltage/current converter 320 comprises an N-type transistor NMOS3, for example. A gate of the transistor NMOS3 receives the input voltage VCOIN, a source of the NMOS3 is coupled to the ground voltage level AVSS, and a drain of the NMOS3 is coupled to the reference current output terminal of the constant current source CS and the first current IA pass therethrough. The current mirror CM and that of FIG. 3A are identical, thus is not repeatedly described herein.

Figure 3C:
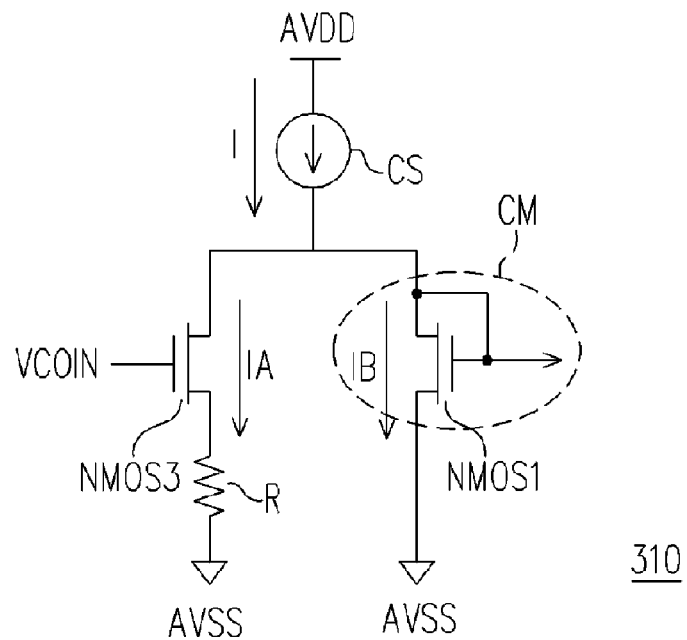
FIG. 3C is a schematic circuit diagram of yet another voltage/current converter of a VCO capable of compensating temperature variation and process fluctuation according to another embodiment of the present invention.

Referring to FIG. 3C, it illustrates another schematic circuit diagram of a voltage/current converter of a VCO capable of compensating temperature variation and fabrication process fluctuation. A gate of the transistor NMOS3 receives the input voltage VCOIN, and a drain is coupled to the reference current output terminal of the constant current source CS and a first current IA passes therethrough. A terminal of the resistor R is coupled to the ground voltage level AVSS, and the other terminal of the resistor R is coupled to the source of the transistor NMOS3. The reference current input terminal of the constant current source CS is coupled to the system voltage AVDD. The current mirror CM is identical to that in FIG. 3A, and thus is not repeatedly described herein.

Figure 3D:
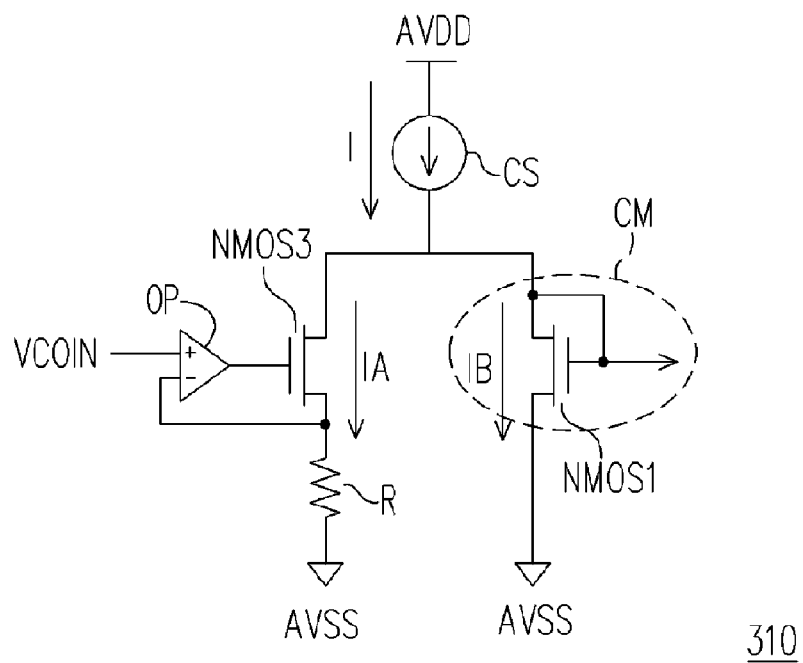
FIG. 3D is a schematic circuit diagram of yet another voltage/current converter of a VCO capable of compensating temperature variation and process fluctuation according to another embodiment of the present invention.

Referring to FIG. 3D, it illustrates another schematic circuit diagram of a voltage/current converter of a VCO capable of compensating temperature variation or fabrication process fluctuation. FIG. 3D, being similar to FIG. 3C, whereas an additional operational amplifier OP is disposed. The operational amplifier OP is coupled between the input voltage VCOIN and the gate of the transistor NMOS3. Wherein a positive input terminal of the operational amplifier OP receives the input voltage VCOIN, a negative input terminal of the operational amplifier OP is coupled to the source of the transistor NMOS3, and an output terminal of the operational amplifier OP is coupled to the gate of the transistor NMOS3.

Figure 3E:
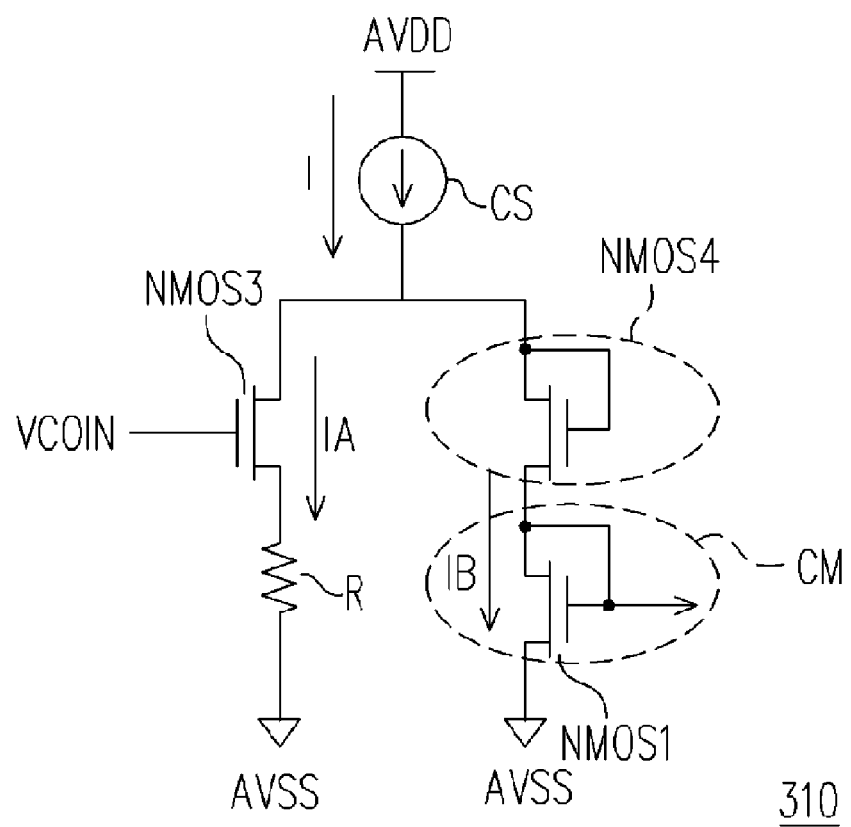
FIG. 3E is a schematic circuit diagram of yet another voltage/current converter of a VCO capable of compensating temperature variation and process fluctuation according to another embodiment of the present invention.

Referring to FIG. 3E, it illustrates another schematic circuit diagram of a voltage/current converter of a VCO capable of compensating temperature variation or fabrication process fluctuation. FIG. 3E is similar to FIG. 3C, whereas an additional N-type transistor NMOS4 is disposed therein. The transistor NMOS4 is coupled between the first current terminal of the current mirror CM and the reference current output terminal of the constant current source CS. Wherein, a source of the transistor NMOS4 is coupled to the first current terminal of the current mirror CM, and a gate and a drain of the transistor NMOS4 are coupled to the reference current output terminal of the constant current source CS. Herein, the transistor NMOS4 is implemented with a N-type transistor, yet for the ordinary skill in the art, an amount of the N-type transistor of NMOS4 can be varied depending upon required, which are all within the scope of the present invention.

Figure 4:
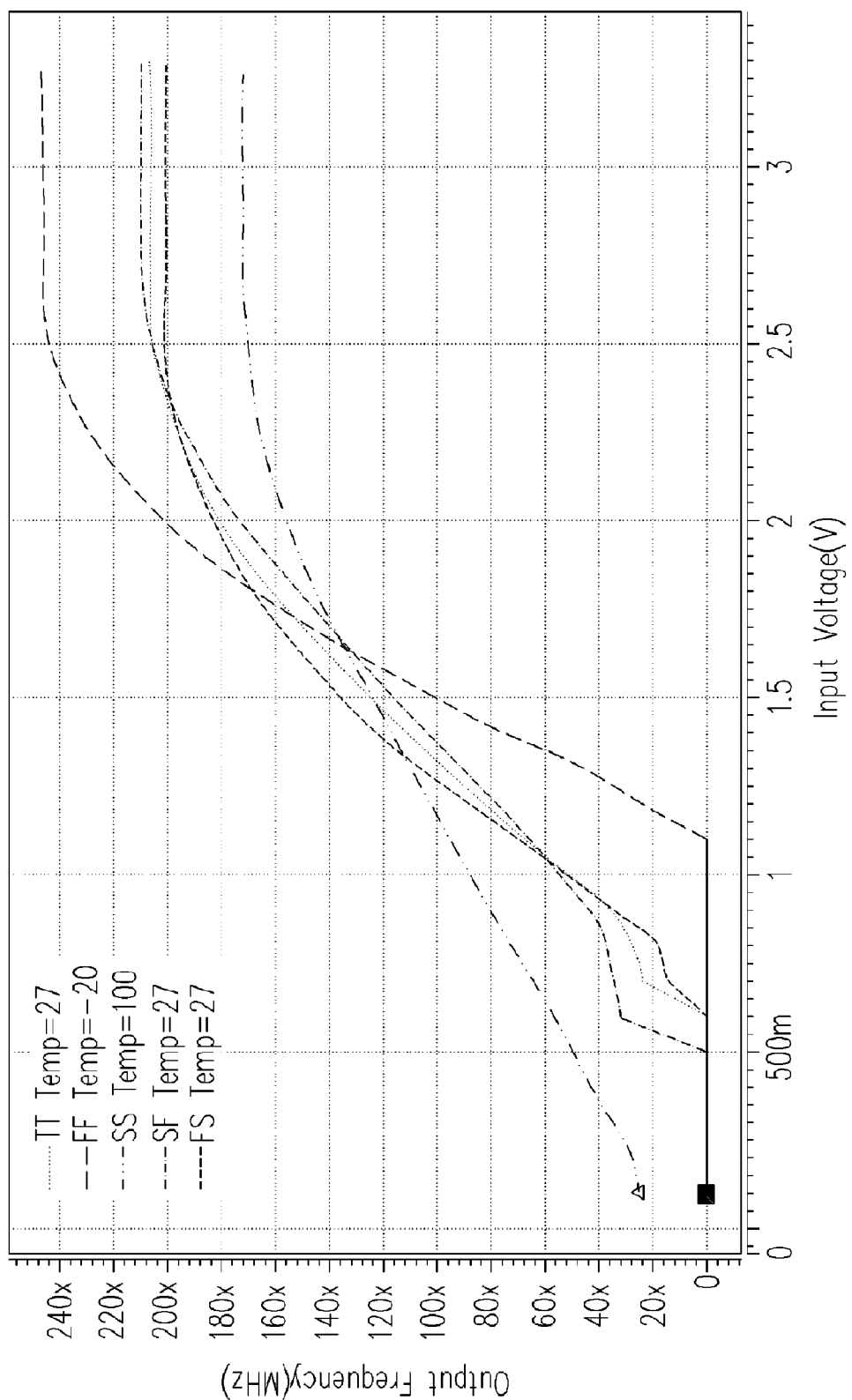
FIG. 4 is a schematic diagram illustrating frequency vs. voltage of the VCO according to one embodiment of the present invention.

Referring to FIG. 4, it illustrates a schematic profile of frequency vs. voltage for the VCO according to one embodiment of the present invention. It is seen that a designated output frequency 133.3 MHz is designed to operate at an around half power voltage, and control voltages corresponding to specified frequencies are evenly distributed within a range pushing transistors to work within saturation area. A range of control voltage corresponding to any frequency is narrowed, thus facilitating usage of the circuit. A power consuming issue incurred by additional reference current can be eliminated by reducing current flow with operational amplification. Even if the reference current cannot be generated by a voltage stabilizer, since a voltage/current converter and VCO are complimentary corresponded, temperature variation and fabrication process fluctuation of the voltage/current converter can be compensated or improved.

Although the invention has been described with reference to a particular embodiment thereof, it will be apparent to those skilled in the art that modifications to the described embodiment may be made without departing from the spirit of the invention. Accordingly, the scope of the invention will be defined by the attached claims and not by the above detailed description.

What is claimed is:

1. A voltage control oscillator, for outputting a clock signal with a frequency according to an input voltage, comprising:
a constant current source, for providing a reference current;
a voltage/current converter, coupled to the constant current source, for determining a first current passing through the voltage/current converter according to the input voltage;
a current mirror, having a first current terminal and a second current terminal, the first current terminal being coupled to the constant current source, for determining a third current passing through the second current terminal according to the second current passing through the first current terminal, wherein the second current is the reference current subtracted by the first current; and
an oscillating circuit, coupled to the second current terminal of the current mirror, for determining the frequency of the outputted clock signal according to the third current.

2. The VCO as recited in claim 1, wherein the oscillating circuit comprises:
a current control oscillator, coupled to the second current terminal of the current mirror, for receiving and determining the frequency according to the third current and outputting a pulse signal having the frequency; and
a wave shaping circuit, coupled to the current control oscillator, for shaping the pulse signal to the clock signal having a specific wave shape.

3. The VCO as recited in claim 1, wherein the constant current source has a reference current input terminal and a reference current output terminal, wherein the reference current output terminal is coupled to a ground voltage level, the reference input terminal is coupled to and receives the first current outputted from the voltage/current converter and the second current outputted from the first current terminal of the current mirror.

4. The VCO as recited in claim 3, wherein the current mirror comprises:
a first P-type transistor, wherein a source of the first P-type transistor is coupled to a system voltage, a gate of the first P-type transistor is coupled to a drain of the first P-type transistor and the reference current input terminal; and
a second P-type transistor, a source of the second P-type transistor is coupled to the system voltage, a gate of the second P-type transistor is coupled to the gate of the first P-type transistor, a drain of the second P-type transistor is coupled to the oscillating circuit.

5. The VCO as recited in claim 3, wherein the voltage/current converter comprises a third P-type transistor, a gate of the third P-type transistor receives the input voltage, a source of the third P-type transistor is coupled to the system voltage, a drain of the third P-type transistor is coupled to the reference current input terminal and outputting the first current.

6. The VCO as recited in claim 5, wherein a body of the third P-type transistor is coupled to the source of the third P-type transistor.

7. The VCO as recited in claim 5, wherein the voltage/current converter further comprises a resistor, wherein the resistor is coupled between the system voltage and the source of the third P-type transistor.

8. The VCO as recited in claim 7, wherein the voltage/current converter further comprises an operational amplifier coupled between the input voltage and the gate of the third P-type transistor, wherein a positive terminal of the operational amplifier receives the input voltage, a negative terminal of the operational amplifier is coupled to the source of the third P-type transistor, and an output terminal of the operational amplifier is coupled to the gate of the third P-type transistor.

9. The VCO as recited in claim 3, further comprising a fourth P-type transistor coupled between the first current terminal of the current mirror and the reference current input terminal, wherein a source of the fourth P-type transistor is coupled to the first current terminal of the current mirror, a gate of the fourth P-type transistor is coupled to a drain of the fourth P-type transistor and the reference current input terminal.

10. The VCO as recited in claim 1, wherein the constant current source has a reference current input terminal and a reference current output terminal, wherein the reference current input terminal is coupled to the system voltage, the reference current output terminal is coupled to the voltage/current converter and the first current terminal of the current mirror.

11. The VCO as recited in claim 10, wherein the current mirror comprises:
 a first N-type transistor, a source of the first N-type transistor is coupled to the ground voltage level, a gate of the first N-type transistor is coupled to a drain of the first N-type transistor and the reference current output terminal; and
 a second N-type transistor, a source of the second N-type transistor is coupled to the ground voltage level, a gate of the second N-type transistor is coupled to the gate of the first N-type transistor, and a drain of the second N-type transistor is coupled to the oscillating circuit.

12. The VCO as recited in claim 10, wherein the voltage/current converter comprises a third n-type transistor, a gate of the third n-type transistor is coupled to the input voltage, a source of the third N-type transistor is coupled to the ground voltage level, a drain of the third N-type transistor is coupled to the reference current output terminal for accommodating the first current.

13. The VCO as recited in claim 12, wherein the voltage/current converter further comprises a resistor, and the resistor is coupled between the source of the third N-type transistor and the ground voltage level.

14. The VCO as recited in claim 13, wherein the voltage/current converter further comprises an operational amplifier coupled between the input voltage and the gate of the third N-type transistor, wherein a positive input terminal of the operational amplifier receives the input voltage, a negative input terminal of the operational amplifier is coupled to the source of the third N-type transistor, an output terminal of the operational amplifier is coupled to the gate of the third N-type transistor.

15. The VCO as recited in claim 10, further comprising a fourth N-type transistor coupled between the first current terminal of the current mirror and the reference current output terminal, wherein a source of the fourth N-type transistor is coupled to the first current terminal of the current mirror, a gate of the fourth N-type transistor is coupled to a drain of the fourth N-type transistor and the reference current output terminal.

16. The VCO as recited in claim 1, wherein the third current is approximately equal to the second current.

\* \* \* \* \*